United States Patent
Miyake

(10) Patent No.: US 7,543,948 B2
(45) Date of Patent: Jun. 9, 2009

(54) MULTILAYER MIRROR MANUFACTURING METHOD, OPTICAL SYSTEM MANUFACTURING METHOD, EXPOSURE APPARATUS, AND DEVICE MANUFACTURING METHOD

(75) Inventor: Akira Miyake, Nasukarasuyama (JP)

(73) Assignee: Canon Kabushiki Kaisha (JP)

( * ) Notice: Subject to any disclaimer, the term of this patent is extended or adjusted under 35 U.S.C. 154(b) by 497 days.

(21) Appl. No.: 11/548,107

(22) Filed: Oct. 10, 2006

(65) Prior Publication Data

US 2007/0188870 A1      Aug. 16, 2007

(30) Foreign Application Priority Data

Oct. 11, 2005      (JP)      ............................... 2005-295848

(51) Int. Cl.
  *G02B 5/08* (2006.01)
(52) U.S. Cl. ....................... 359/846; 359/848; 359/883; 359/900; 359/584
(58) Field of Classification Search ................. 359/584, 359/846, 848, 883, 900
See application file for complete search history.

(56) References Cited

U.S. PATENT DOCUMENTS

| 4,066,344 A | * | 1/1978 | Talapatra ..................... 359/848 |
| 6,011,646 A | | 1/2000 | Mirkarimi et al. |
| 6,319,635 B1 | * | 11/2001 | Mirkarimi et al. ............... 430/5 |
| 6,898,011 B2 | * | 5/2005 | Kandaka et al. ............. 359/584 |
| 7,203,275 B2 | * | 4/2007 | Shiraishi ....................... 378/84 |
| 7,311,407 B2 | * | 12/2007 | Yamamoto et al. .......... 359/846 |
| 7,453,560 B2 | * | 11/2008 | Miyake ................... 356/237.2 |
| 2003/0147139 A1 | | 8/2003 | Kandaka et al. |
| 2004/0179179 A1 | | 9/2004 | Terashima |
| 2005/0087699 A1 | | 4/2005 | Miyake |

FOREIGN PATENT DOCUMENTS

| JP | 11-38192 | 2/1999 |
| JP | 2001-27700 | 1/2001 |

* cited by examiner

*Primary Examiner*—Ricky D Shafer
(74) *Attorney, Agent, or Firm*—Rossi, Kimms & McDowell, LLP

(57) ABSTRACT

A method for manufacturing a multilayer mirror that includes a substrate and a multilayer film formed on the substrate, and has a reflection surface shape includes the steps of estimating a surface shape variation amount as a difference between a surface shape of the substrate before the multilayer film is formed on the substrate and a surface shape of the multilayer mirror after the multilayer film is formed on the substrate, processing the surface shape of the substrate into a shape generated by subtracting the surface shape variation amount from the reflection surface shape, and forming the multilayer film on the substrate processed by the processing step.

3 Claims, 8 Drawing Sheets

MULTILAYER MIRROR MANUFACTURING METHOD, OPTICAL SYSTEM MANUFACTURING METHOD, EXPOSURE APPARATUS, AND DEVICE MANUFACTURING METHOD

BACKGROUND OF THE INVENTION

The present invention relates generally to a manufacturing method, and more particularly to a manufacturing method of a multilayer mirror and an optical system in an exposure apparatus used to expose a plate, such as a single crystal substrate for a semiconductor wafer, and a glass substrate for a liquid crystal display ("LCD"). The present invention is suitable, for example, for an exposure apparatus that uses an ultraviolet ("UV") light and an extreme ultraviolet ("EUV") light as an exposure light source.

A reduction projection exposure apparatus has been conventionally employed which uses a projection optical system to project a circuit pattern of a mask or a reticle onto a wafer, etc. to transfer the circuit pattern, in manufacturing fine semiconductor devices using the photolithography technology.

The minimum critical dimension ("CD") transferable by the projection exposure apparatus or resolution is proportionate to a wavelength of the light used for the exposure, and inversely proportionate to the numerical aperture ("NA") of the projection optical system. The shorter the wavelength is, the better the resolution is. Recent demands for finer processing to semiconductor devices have promoted use of a shorter wavelength of the UV light from an ultra-high pressure mercury lamp (an i-line with a wavelength of approximately 365 nm) to a KrF excimer laser (with a wavelength of approximately 248 nm) and an ArF excimer laser (with a wavelength of approximately 193 nm).

However, the semiconductor devices become rapidly finer, and the lithography using the UV light has the limit. The projection exposure apparatus using the EUV light with a wavelength of 10 to 15 nm shorter than that of the UV light, which is referred to as an "EUV exposure apparatus"hereinafter, has been developed for efficient transfers of very fine circuit patterns smaller than 0.1 μm.

Since materials greatly absorb the light in a wavelength range of the EUV light, a dioptric optical element or system (that utilizes refractions of the light) for use with the visual light and the UV light is not viable. Therefore, the EUV exposure apparatus uses a catoptric optical element or system that utilizes reflections of the light. The catoptric optical element in the EUV exposure apparatus includes an oblique incidence total reflection mirror and a multilayer mirror.

The wave range of the EUV light has a refractive index's real part of slightly smaller than 1, and is totally reflected by increasing an incident angle to introduce the light almost parallel to the reflection surface. The oblique incidence total reflection mirror can acquire such a reflectance as 80% or greater with an oblique incidence with an angle between several degrees to 10° from the reflection surface. However, the oblique incidence total reflection mirror is not suitable for practical use because it makes an optical system large and has little optical design freedom.

The catoptric optical element for the EUV exposure apparatus uses a multilayer mirror that alternately forms or layers two kinds of materials having different optical constants on a glass substrate. The multilayer mirror can obtain a high reflectance at an incident angle close to the normal incidence. The multilayer mirror reflects an EUV light with a specific wavelength when receiving the EUV light. In other words, the multilayer mirror has a wave selection. For example, only the EUV light in a narrow bandwidth around a wavelength λ that is approximately expressed by Bragg's equation below is effectively reflected where θ is an incident angle, λ is the wavelength of the EUV light, d is a coating cycle, and m is an order:

$$2 \times d \times \cos\theta = m \times \lambda \qquad \text{[EQUATION 1]}$$

The multilayer film used for the multilayer mirror includes a W/C multilayer film that alternately layers tungsten (W) and carbon (C), a Mo/C multilayer film that alternately layers molybdenum (Mo) and C, etc. In particular, a Mo/Si multilayer film that alternately layers Mo and silicon (Si) has a high transmittance at a long wavelength side of the L absorption edge (wavelength of 12.4 nm) of Si, and can relatively easily obtain the reflectance of 60% or greater to the normal incidence near the wavelength of 13 nm. The multilayer mirror having the Mo/Si multilayer film is used for such R & D fields as an X-ray telescope and an X-ray laser resonator, and an application to the EUV exposure apparatus is expected.

The multilayer film is produced by the thin-film forming technology, such as a sputtering method, a vacuum evaporation method, and a CVD. For example, the Mo/Si multilayer film is produced by the sputtering method. However, the thin film produced by the sputtering generally has an internal compression stress. The internal stress generated in the Mo/Si multilayer film deforms the substrate in the multilayer mirror, and causes the wavefront aberration in the optical system. As a result, the optical characteristic of the multilayer mirror deteriorates.

Prior art propose various technologies to reduce the internal stress in the Mo/Si multilayer film. See, for example, Japanese Patent Applications, Publication Nos. 11-38192 and 2001-27700, and U.S. Pat. No. 6,011,646. More specifically, Japanese Patent Application, Publication No. 11-38192 proposes a method for controlling the internal stress in the multilayer film by adjusting the content of boron (B) in the Si layer. Japanese Patent Application, Publication No. 2001-27700 proposes a method for reducing the internal stress in the multilayer film by forming a ruthenium (Ru) layer in at least one of the Mo layers. U.S. Pat. No. 6,011,646 proposes a method for cancel the internal stress in the multilayer film by forming, between the substrate and the multilayer film, a stress compensating layer that has a stress in a direction different from or opposite to the internal stress direction in the multilayer film.

The methods for including B or for forming the Ru layer in the thin-film layer in the multilayer film reduce the internal stress by modifying the coating structure that maximizes the reflectance of the multilayer film. These methods effectively reduce the internal stress in the multilayer film, but inevitably cause the deterioration of the reflectance. In addition, since these methods need to add a additional layer (made of an additional material) to the Mo layer and the Si layer, the film forming apparatus and procedure become complex, causing problems of a long film forming process and a deteriorated film forming precision.

On the other hand, the method for canceling the internal stress using the stress compensating layer causes a minute roughness (smaller than 1 nm) on the stress compensating layer, and lowers the reflectance of the multilayer film on the stress compensating layer. The multilayer mirror preferably dispenses with the minute thickness distribution or film thickness unevenness in the mirror plane. However, the minute roughness on the surface of the relaxation stress layer appears on the multilayer film, and the reflection surface shape precision of the multilayer film lowers (or the reflection surface shape cannot be turned into a desired shape). The optical system that includes the multilayer mirror causes a large wavefront aberration.

BRIEF SUMMARY OF THE INVENTION

Accordingly, the present invention is directed to a multilayer mirror manufacturing method that can maintain a high reflectance and maintain an intended reflection surface shape.

A method according to one aspect of the present invention for manufacturing a multilayer mirror that includes a substrate and a multilayer film formed on the substrate, and has a reflection surface shape includes the steps of estimating a surface shape variation amount as a difference between a surface shape of the substrate before the multilayer film is formed on the substrate and a surface shape of the multilayer mirror after the multilayer film is formed on the substrate, processing the surface shape of the substrate into a shape generated by subtracting the surface shape variation amount from the reflection surface shape, and forming the multilayer film on the substrate processed by the processing step.

A method according to another aspect of the present invention for manufacturing an optical system that includes plural multilayer mirror includes the steps of estimating a surface shape variation amount as a difference between a surface shape of a substrate before a multilayer film is formed on the substrate and a surface shape of the multilayer mirror after the multilayer film is formed on the substrate, forming the multilayer film on the substrate, and producing part of plural multilayer mirrors, calculating a surface shape necessary for the plural multilayer mirrors except for the part based on a surface shape of the part produced by the producing step, processing a surface shape of the substrate necessary to produce the plural multilayer mirrors except the part into a shape generated by subtracting the surface shape variation amount from the surface shape necessary for the plural multilayer mirrors except the part calculated by the calculating step, forming the multilayer film on the substrate processed by the processing step, and producing the plural multilayer mirrors except for the part, and incorporating the plural multilayer mirrors produced by the producing step into a mirror barrel.

A method according to still another aspect of the present invention for manufacturing an optical system that includes plural multilayer mirror includes the steps of estimating a surface shape variation amount as a difference between a surface shape of a substrate before a multilayer film is formed on the substrate and a surface shape of the multilayer mirror after the multilayer film is formed on the substrate, forming the multilayer film on the substrate, and producing part of plural multilayer mirrors, measuring an optical characteristic when the part produced by the producing step is incorporated into a mirror barrel, calculating a surface shape necessary for the plural multilayer mirrors except for the part based on a measurement result by the measuring step, processing a surface shape of the substrate necessary to produce the plural multilayer mirrors except the part into a shape generated by subtracting the surface shape variation amount from the surface shape necessary for the plural multilayer mirrors except for the part calculated by the calculating step, forming the multilayer film on the substrate processed by the processing step, and producing the plural multilayer mirrors except for the part, and incorporating the plural multilayer mirrors produced by the producing step into a mirror barrel.

A multilayer mirror manufactured by the above method, and an exposure apparatus that includes this multilayer mirror also constitute one aspect of the present invention. An optical system manufactured by the above method and an exposure apparatus that includes this optical system also constitute one aspect of the present invention. A device manufacturing method according to another aspect of the present invention includes the steps of exposing a plate using the above exposure apparatus, and developing the plate that has been exposed.

Other objects and further features of the present invention will become readily apparent from the following description of the preferred embodiments with reference to accompanying drawings.

DETAILED DESCRIPTION OF THE PREFERRED EMBODIMENTS

Figure 1:
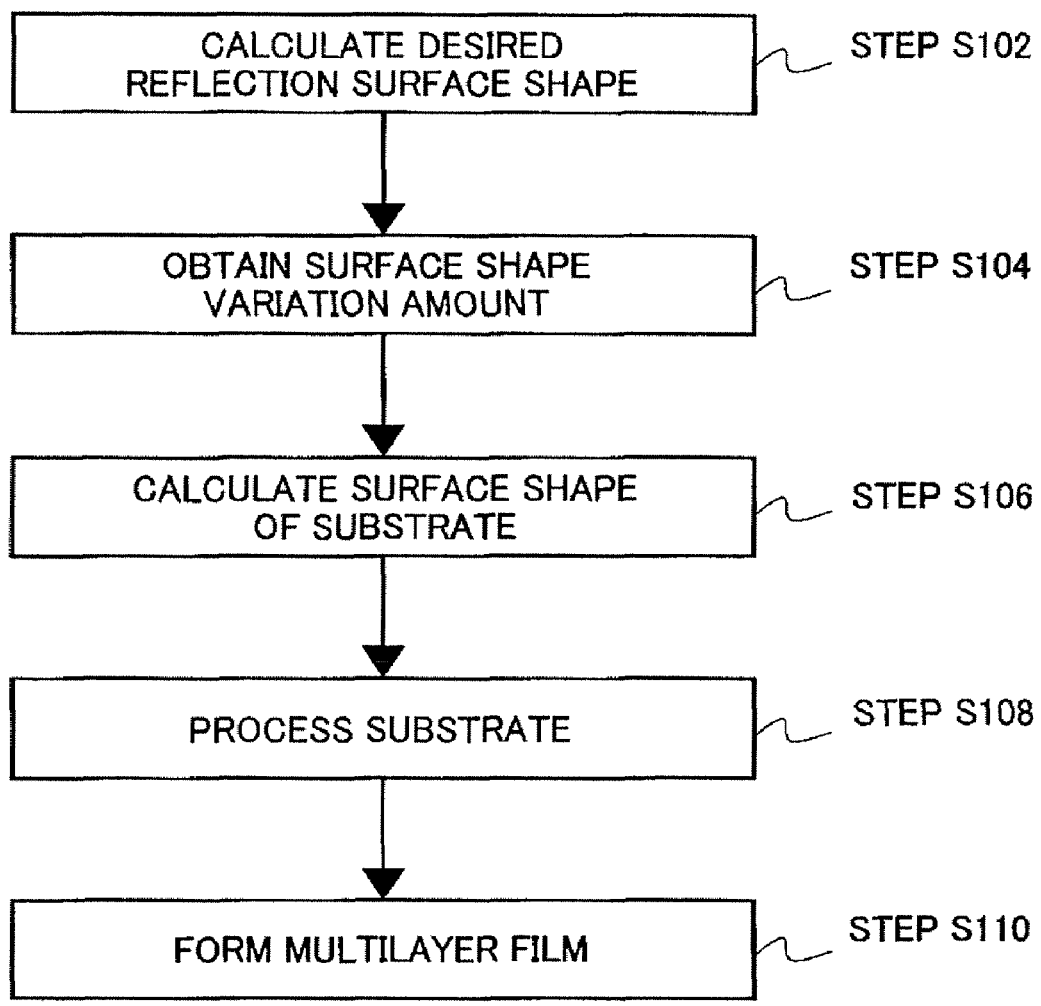
FIG. 1 is a flowchart for explaining a manufacturing method of a multilayer mirror as one aspect of the present invention.

Referring now to the accompanying drawings, a description will be given of a preferred embodiment of the present invention. The same element in each figure is designated by the same reference numeral, and a duplicate description will be omitted.

First Embodiment

In a first embodiment, a description will be given of a multilayer mirror manufacturing method 100 according to one aspect of the present invention. FIG. 1 is a flowchart for explaining the multilayer mirror manufacturing method 100 of this embodiment. The multilayer mirror manufactured by the manufacturing method is suitable for a catoptric optical system for the EUV light such as a projection optical system in the EUV exposure apparatus, and optical systems for a microscope and an astronomical telescope. These optical systems are required to restrain the wavefront aberration to the limit so as to image the EUV light at a high resolution or to maintain the wavefront aberration value sufficiently small. In particular, the projection optical system in the EUV exposure apparatus used for the diffraction limit needs to restrain the wavefront aberration to one over several tens as large as the EUV light's wavelength. The inventive manufacturing method 100 can manufacture a multilayer mirror having a desired wavefront shape, as described later, and restrain the wavefront aberration to the limit.

Referring to FIG. 1, a target or desired reflection surface shape for the multilayer mirror is calculated based on the optical characteristic required for the multilayer mirror (step S102). In general, a reflection surface shape optimal to the multilayer mirror is calculated based on an optical design so as to realize the optical characteristic, such as a required resolution at a necessary angle of view.

Figure 2A:
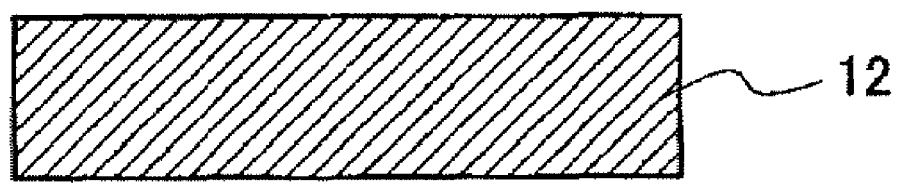
FIGS. 2A and 2B are views for explaining a change of a reflection surface shape of the multilayer mirror.
Figure 2B:
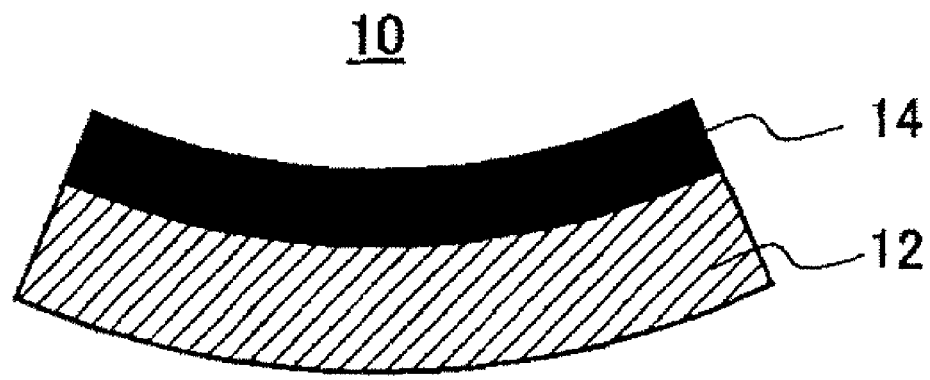

Next, a variation amount of the reflection surface shape is calculated when the multilayer film is formed on the substrate (step s104). In general, a substrate 12 used to manufacture a multilayer mirror 10 is polished or processed into a desired reflection surface shape, as shown in FIG. 2A. Therefore, when a multilayer film 14 is formed on the substrate 12, the internal stress occurs in the multilayer film 14 and deforms the reflection surface shape of the manufactured multilayer mirror 10 from the desired reflection surface shape, as shown in FIG. 2B. The step s104 estimates a difference or a surface shape variation amount between a surface shape of the substrate 10 before the multilayer film 14 is formed on the substrate 12 and a surface shape of the multilayer mirror 10 (multilayer film 14) after the multilayer film 14 is formed on the substrate 12. Here, FIGS. 2A and 2B are views for explaining a change of the reflection surface shape of the multilayer mirror 10.

More specifically, first, an interferometer or another instrument measures the surface shape of the substrate before the multilayer film is formed on the substrate, producing a measurement value A. Next, the multilayer film is formed on the substrate (test formation), and the interferometer or another instrument measures the surface shape of the multilayer film, producing a measurement value B. A surface shape variation amount is calculated from a difference between the two measurement values as (measurement value B)−(measurement value A). Alternatively, the surface shape variation amount may be estimated by measuring a physical value, such as an internal stress in the multilayer film and a rigidity of the substrate, and by applying an analytical method, such as a finite element method, using the measurement values. The internal stress of the multilayer film may be obtained, for example, by forming the multilayer film on a thin silicon wafer and by measuring the variation amount (warping amount) of the silicon wafer.

When the multilayer film formed on the substrate has an uneven film thickness, the surface shape variation amount reflects this uneven amount. In other words, the thicker portion than the periphery of the surface shape rises around the periphery in the mirror plane.

Next, the surface shape of the substrate used to manufacture the multilayer mirror having a desired reflection surface shape is calculated based on the reflection surface shape of the multilayer mirror calculated by the step s102 and the surface shape variation amount calculated by the step s104 (step s106). More specifically, the surface shape variation amount estimated by the step s104 is subtracted from the reflection surface shape calculated by the step s102, and the surface shape of the substrate used to manufacture the multilayer mirror having a desired reflection surface shape is calculated. Alternatively, in assembling and adjusting an optical system that uses a multilayer mirror, a correctable shape error may be subtracted and the surface shape of the substrate may be calculated. Assume, for example, that even when the desired reflection surface shape is axially symmetrical and the radius of curvature of the spherical surface that approximates the shape shifts to some extent, the desired optical characteristic can be obtained by adjusting the interval in the multilayer mirror in the optical system. In that case, a fine spherical surface component can be added to or subtracted from the surface shape of the substrate. Thereby, the surface shape of the substrate can have a shape that can be easily processed.

In addition, the surface shape of the substrate may be calculated in the multilayer film formed on the mirror by subtracting a designed film thickness distribution corresponding to the incident angle distribution in the mirror plane.

Figure 3:
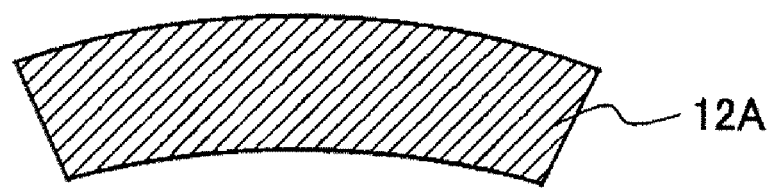
FIG. 3 is a view showing a substrate processed by the steps S102 to S108 in FIG. 1.

The substrate is processed based on the surface shape of the substrate calculated in the step s106 (step s108). More specifically, the process of the substrate and the measurement of the processed surface shape are repeated until the surface shape calculated in the step s106 falls within a permissible error range. The permissible error range is determined by a permissible amount of a wavefront aberration which the manufactured multilayer mirror should achieve. Of course, when the optical system includes plural multilayer mirrors, the permissible error range is determined by assigning to each multilayer mirror a permissible amount of a wavefront aberration which the optical system should finally achieve. FIG. 3 shows a substrate 12A processed through the steps s102 to s108. Referring to FIG. 3, the surface shape of the substrate 12A differs from the substrate 12 shown in FIG. 2A by the surface shape variation amount.

Next, the multilayer film is formed on the substrate processed by the step s108 (step s110). In this case, the multilayer film forming condition preferably is common to that used to estimate the surface shape variation amount. Thereby, the internal stress in the multilayer film formed by the step s110 can be approximately the same as the internal stress in the multilayer film formed by the step s104. In other words, the surface shape variation amount of the multilayer mirror can be made approximately the same. In addition, the film thickness distribution of the multilayer film formed by the step s110 can be made approximately the same as the film thickness distribution of the multilayer film formed by the step s104, and the surface shape variation amount of the multilayer mirror can be made approximately the same.

Figure 4:
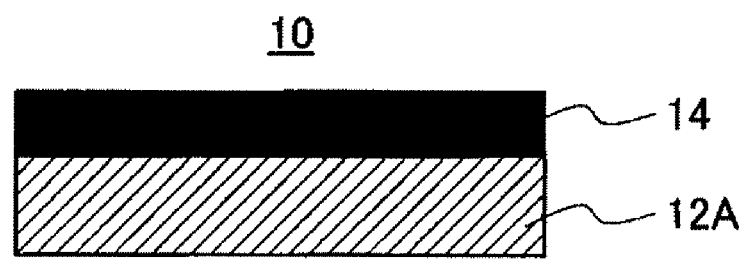
FIG. 4 is a view showing a multilayer mirror in which a multilayer film is formed on the substrate processed by the step S108 in FIG. 1.

FIG. 4 is a view of the multilayer mirror 10 formed on the multilayer film 14 on the substrate 12A processed by the step s108. Referring to FIG. 4, the internal stress of the multilayer film 14 formed on the substrate 12A deforms the substrate 12A. The variation amount is approximately equal to the surface shape variation amount estimated in the step s104. The substrate 12A has been processed into the desired surface shape from which the surface shape variation amount is subtracted. Therefore, the shape of the substrate 12A that has deformed due to the internal stress in the multilayer film 14 is very close to the desired reflection surface shape calculated in the step s102.

Thus, the inventive manufacturing method 100 can aggressively maximize the internal stress in the multilayer film, and manufacture a multilayer mirror having a desired reflection surface even when the substrate deforms due to the internal stress in the multilayer film. When an optical system includes plural multilayer mirrors each having a desired reflection surface shape, and each manufactured by the inventive manufacturing method 100, the deterioration of the optical performance caused by the internal stress in the multilayer film can be restrained. A wavefront aberration of the optical system is restrained down to an extremely small value, and the optical system can achieve an excellent optical characteristic, such as a resolution.

The inventive manufacturing method 100 does not need a stress relaxation layer that cancels out the internal stress in the multilayer film, or a specific coating structure that reduces the internal stress. Therefore, the manufacturing method 100 can maximize the multilayer film structure that makes the reflectance highest, and manufacture a multilayer film having a high reflectance. In other words, the inventive manufacturing method 100 can manufacture a multilayer film having a desired reflection surface shape using a multilayer film structure that maximizes the reflectance of the multilayer film. The multilayer mirror manufactured by the inventive manufacturing method 100 has a high reflectance, and realizes an optical apparatus having an excellent throughput. Without a stress relaxation layer or a specific coating structure, the manufacturing process of the multilayer mirror is maintained simple (or can achieve a short manufacturing time period), and can easily manufacture a multilayer mirror having an excellent optical characteristic.

The inventive manufacturing method 100 corrects not only the reflection surface shape deformation due to the internal stress of the multilayer film but also the reflection surface shape deformation due to the in-plane film thickness distribution in forming the multilayer film, manufacturing a multilayer mirror having a desired reflection surface shape. In estimating the surface shape variation amount of the multilayer mirror, this embodiment forms a multilayer film on a substrate and measures the surface shape, because the measured surface shape contains information of the in-plane film thickness distribution of the formed multilayer film. In other words, the surface shape variation amount of the multilayer mirror contains the surface shape deformation amount due to the in-plane film thickness distribution of the multilayer film. In addition, the surface shape variation amount of the multilayer mirror contains all surface shape variation amounts caused by forming the multilayer film. Thus, the inventive manufacturing method 100 can manufacture the multilayer mirror having a desired reflection surface shape even when the substrate undergoes deformations due to the multilayer film formation.

Second Embodiment

Figure 5:
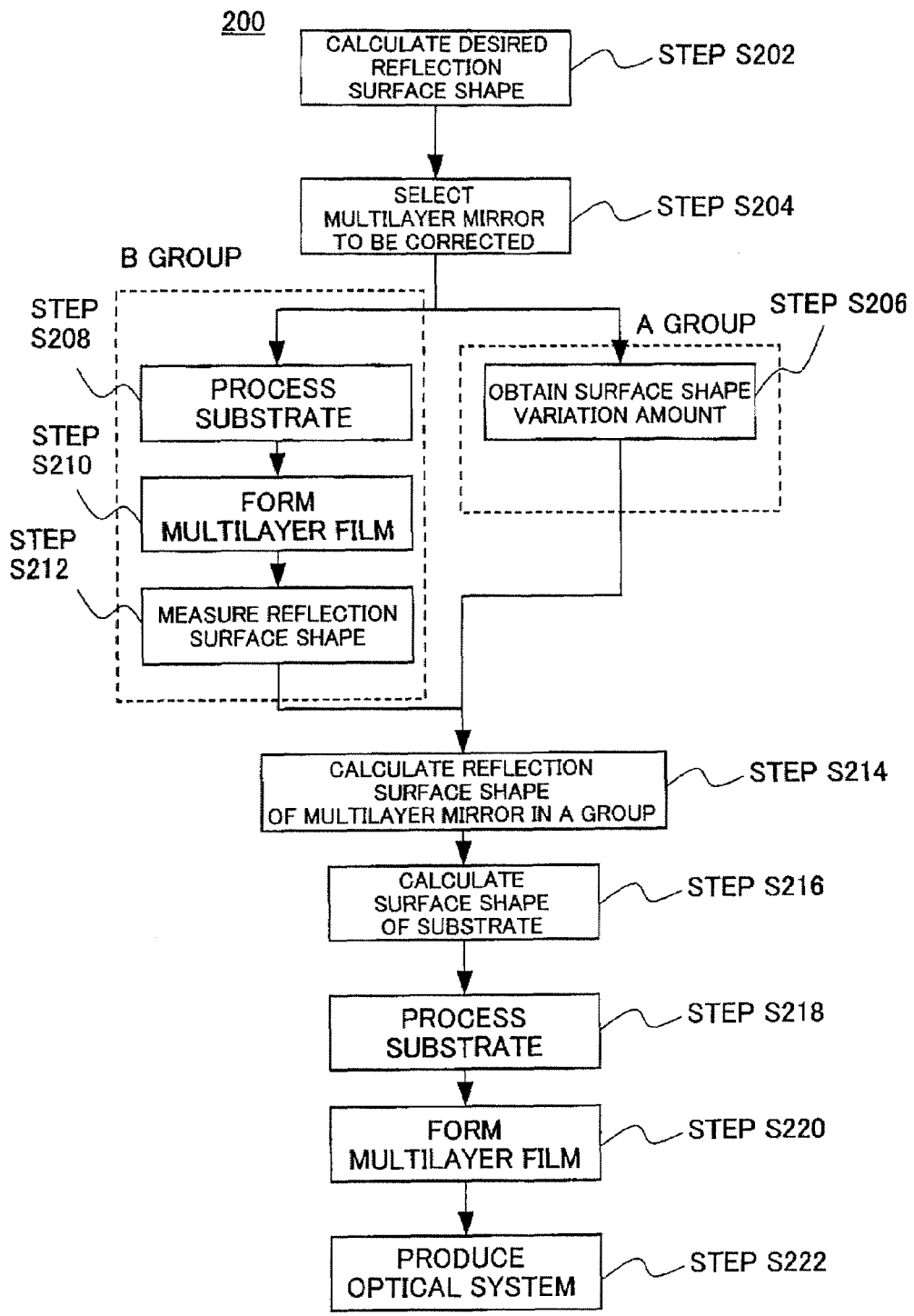
FIG. 5 is a flowchart for explaining a manufacturing method as one aspect of the present invention.

In a second embodiment, a description will be given of a multilayer mirror manufacturing method 200 according to one aspect of the present invention. FIG. 5 is a flowchart for explaining the multilayer mirror manufacturing method 200 of this embodiment. The inventive manufacturing method 200 manufactures an optical system that includes plural multilayer mirrors. The multilayer mirror manufactured by the inventive manufacturing method 200 is suitable for a catoptric optical system for the EUV light such as a projection optical system in the EUV exposure apparatus, and optical systems for a microscope and an astronomical telescope. These optical systems are required to restrain the wavefront aberration to the limit so as to image the EUV light at a high resolution or to maintain the wavefront aberration value sufficiently small. In particular, the projection optical system in the EUV exposure apparatus used for the diffraction limit needs to restrain the wavefront aberration to one over several tens as large as the EUV light's wavelength. The inventive manufacturing method 200 can manufacture an optical system, as described later, while restraining its wavefront aberration to the limit.

Referring to FIG. 5, a target or desired reflection surface shape for each multilayer mirror in the optical system is calculated based on the optical characteristic required for the optical system (step s202). In general, a reflection surface shape optimal to each multilayer mirror is calculated based on an optical design so as to realize the optical characteristic, such as a required resolution at a necessary angle of view. Preferably, in that case, the reflection surface shape of each multilayer mirror may be calculated by considering a parameter, such as an interval of each multilayer mirror.

Next, plural multilayer mirrors in the optical system are classified into A group of multilayer mirrors having a reflection surface to be corrected, and B group of multilayer mirrors having a reflection surface that does not need any correction (step s204). For example, based on the optical design of the step s202, the multilayer mirrors that greatly affect the optical characteristic of the optical system when the reflection surface shape is corrected or is sensitive to the wavefront aberration are assigned to the A group.

For the multilayer mirrors in A group, which have the reflection surface shapes to be corrected, a reflection surface variation amount is calculated when the multilayer film is formed on the substrate (step s206). As described in the first embodiment, the surface shape variation amount can be estimated, for example, from a difference between a surface shape of the substrate before the multilayer film is formed on the substrate and a surface shape of the multilayer mirror (multilayer film) after the multilayer film is formed on the substrate. The step s206 estimates a surface shape variation amount using a simulation and a test substrate, instead of forming the multilayer film on the substrate in the actual multilayer mirror in A group. In other words, the step s206 does not form the multilayer film on the substrate in the multilayer mirror in A group.

On the other hand, for the multilayer mirror that belongs to B group and has a reflection surface shape that does not need to be corrected, the surface shape of the substrate is processed based on the reflection surface shape calculated in the step s202 (step s208). Next, the multilayer film is formed on the substrate processed in the step s208 (step s210), and the surface shape of the multilayer mirror (multilayer film) after the multilayer film is formed on the substrate is measured (step s212). Since the surface shape of the multilayer mirror of B group measured by the step s212 deforms from the desired reflection surface shape calculated by step s202 because the substrate deforms due to the stress of the multilayer film.

The order of steps s206 and s208-s212 is arbitrary or each step may be performed in parallel.

Next, in order to realize the optical characteristic required for the optical system, the reflection surface shape is calculated based on the reflection surface shape of the multilayer mirror in B group measured by the step s212 (step s214). As described above, the reflection surface shape of the multilayer mirror in B group has shifted from the desired reflection surface shape calculated by the step s202, and the optical system that includes the multilayer mirror cannot obtain the desired optical characteristic. Accordingly, in order to obtain the desired optical characteristic, it is adjusted or optimized using the reflection surface shape of the multilayer mirror in A group.

Next, the surface shape of the substrate used to manufacture the multilayer mirror of A group is calculated based on the reflection surface shape of the multilayer mirror in A group calculated by the step s214 and the surface shape variation amount calculated by the step s206 (step s216). More specifically, the surface shape variation amount calculated by the step s206 is subtracted from the reflection surface shape calculated by the step s214, and the result is used for the surface shape of the substrate so as to manufacture the multilayer mirror of A group. Alternatively, in assembling and adjusting an optical system, a correctable shape error may be subtracted and the surface shape of the substrate may be calculated. Assume, for example, that when the reflection surface shape is axially symmetrical, and the radius of curvature of the spherical surface that approximates the shape shifts to some extent, a desired optical characteristic can be obtained by adjusting the interval in the multilayer mirror in the optical system. In that case, a fine spherical surface component can be added to or subtracted from the surface shape of the substrate. Thereby, the surface shape of the substrate can have an easily processable shape.

The substrate in the multilayer mirror in A group is processed based on the surface shape of the substrate calculated in the step s216 (step s218). More specifically, a process of the substrate and a measurement of the processed surface shape are repeated until the surface shape calculated in the step s216 falls within a permissible error range. The permissible error range is determined by assigning to each multilayer mirror a permissible amount of a wavefront aberration which the optical system should finally achieve.

Next, the multilayer film is formed on the substrate in the multilayer mirror in A group processed by the step s218 (step s220). In this case, the multilayer film forming condition preferably is common to that used to estimate the surface shape variation amount. Thereby, the internal stress and the film thickness distribution in the multilayer film formed by the step s220 can be approximately equal to those in the multilayer film formed by the step s206. Therefore, the shape of the substrate that has deformed due to the internal stress in the multilayer film is very close to the desired reflection surface shape calculated in the step s216.

Next, the multilayer mirrors in B group manufactured in the step s210 and the multilayer mirrors in A group manufactured in the step s220 are incorporated into a mirror barrel (step s222), and the optical system is manufactured.

Thus, the inventive manufacturing method 200 can manufacture the optical system having a desired optical characteristic, because the reflection surface shape of the multilayer mirror in A group is adjusted even when the multilayer film in the multilayer mirror of B group deforms due to the internal stress. A wavefront aberration of the thus manufactured optical system is restrained down to an extremely small value, and the optical system can achieve an excellent optical characteristic, such as a resolution. The reflection surface shape of the multilayer mirror in A group can be turned into a desired reflection surface shape corresponding to the deformation of the multilayer film in B group using the measuring method 100 described in the first embodiment.

Thus, the inventive manufacturing method 200 does not require a stress relaxation layer that cancels out the internal stress in the multilayer film, or a specific coating structure that reduces the internal stress. Therefore, the manufacturing method 200 can maximize the multilayer film structure that makes the reflectance highest, and manufacture the optical system having a desired optical characteristic. In other words, the inventive manufacturing method 200 can manufacture an optical system having a desired optical characteristic using a multilayer film structure that maximizes the reflectance of the multilayer film. The multilayer mirror manufactured by the inventive manufacturing method 200 has a high reflectance, and realize an optical apparatus having an excellent throughput. Without a stress relaxation layer or a specific coating structure, the manufacturing process of the multilayer mirror is maintained simple (or can achieve a short manufacturing time period), and can easily manufacture a multilayer mirror having an excellent optical characteristic. Even when the film thickness distribution of the formed multilayer film is different from the designed value, this embodiment can restrain the wavefront aberration down to an extremely small value, and achieve an excellent optical characteristic.

The inventive manufacturing method 200 previously selects the multilayer mirrors having reflection surface shapes to be adjusted, but may select the multilayer mirrors having reflection surface shapes to be adjusted after all the multilayer films are formed on all the multilayer mirrors (or after all the multilayer mirrors are manufactured). In that case, only the multilayer film should be removed from the substrate on which the multilayer film has been formed. In reality, chemical etching is used to remove the multilayer film, and thus the substrate is also etched and it is very difficult to remove only the multilayer film. Therefore, it is preferable to previously select the multilayer mirrors having reflection surface shapes to be adjusted as in this embodiment, and not to form the multilayer film on the substrate of the multilayer mirror. Although it is of course possible to process the substrate from which the multilayer film is etched, into the reflection surface shape calculated by the step s216, this method is not preferable due to a long processing time period.

Third Embodiment

Figure 6:
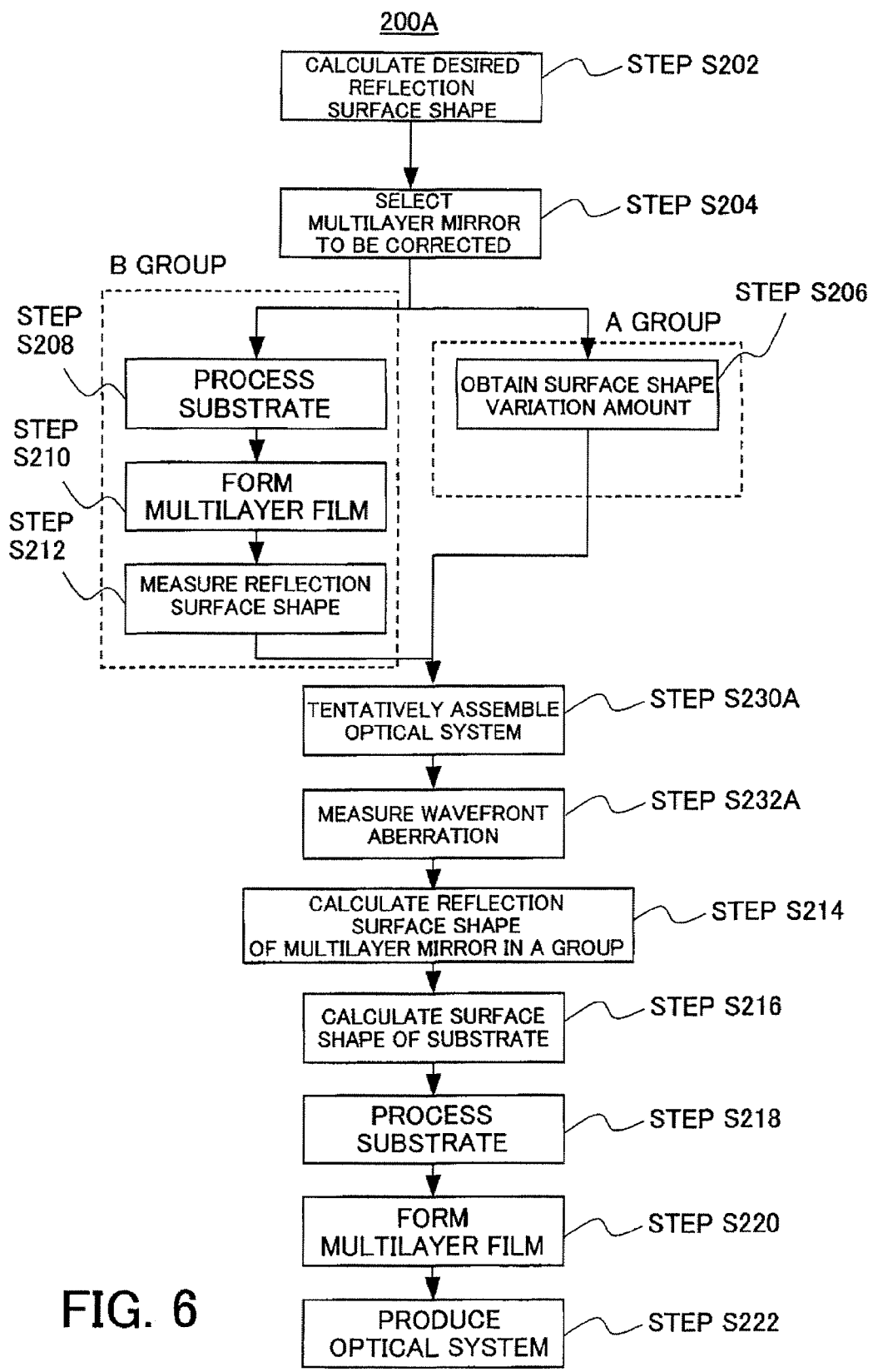
FIG. 6 is a flowchart for explaining a manufacturing method as one aspect of the present invention.

In a third embodiment, a description will be given of a multilayer mirror manufacturing method 200 according to one aspect of the present invention. FIG. 6 is a flowchart for explaining the multilayer mirror manufacturing method 200A of this embodiment. The inventive manufacturing method 200A includes the steps s230A and s232A unlike the manufacturing method 200. Those steps in FIG. 6, which are the same as corresponding steps in FIG. 5, are designated by the same reference numerals, and a description thereof will be omitted.

Referring FIG. 6, an optical system is tentatively assembled through the steps s202 to s212, where the step s210 combines the multilayer mirror in B group in which the multilayer film is formed on the substrate with the multilayer mirror in A group in which the multilayer film is not formed (step 230A).

Next, the wavefront aberration of the optical system tentatively assembled by the step s230A is measured (step s232A). More specifically, the wavefront aberration of the optical system is measured by a known measuring method using a visual light or UV light, such as a point diffraction interferometry ("PDI"), a lateral shearing interferometry ("LSI"), and a Shack Hartmann method. The assembly state of the optical system, such as an interval in the multilayer mirror, may be again adjusted so that the measured wavefront aberration can reduce.

The tentatively assembled optical system cannot obtain a desired optical characteristic, since the reflection surface shape of the multilayer mirror in B group shifts from the desired reflection surface shape calculated by the step s202. Accordingly, so as to obtain the desired optical characteristic, it is adjusted or optimized using the reflection surface shape of the multilayer mirror in A group.

Next, in order to realize the optical characteristic required for the optical system based on the wavefront aberration measured by the step s232A, the reflection surface shape required for the multilayer mirror in A group is calculated (step s214). The surface shape of the substrate used to manufacture the multilayer mirror in A group is calculated based on the reflection surface shape of the multilayer mirror in A group calculated by the step s214 and the surface shape variation amount estimated by the step s206 (step s216). More specifically, the surface shape of the substrate used to manufacture the multilayer mirror in A group is calculated as the reflection surface shape calculated by the step s214 subtracted from the surface shape variation amount calculated by the step s206.

Similar to the second embodiment, the optical system is manufactured through the steps s218 to s222.

Thus, the inventive manufacturing method 200A can manufacture the optical system having a desired optical characteristic, because the reflection surface shape of the multilayer mirror in A group is adjusted even when the multilayer film in the multilayer mirror of B group deforms due to the internal stress. A wavefront aberration of the thus manufactured optical system is restrained down to an extremely small value, and the optical system can achieve an excellent optical characteristic, such as a resolution. Since the manufacturing method 200A tentatively assembles the actual optical system after producing the multilayer mirror in B group, the wavefront aberration for actual use can be restrained down to a smaller value.

The inventive manufacturing method 200A does not require a stress relaxation layer that cancels out the internal stress in the multilayer film, or a specific coating structure that reduces the internal stress. Therefore, the manufacturing method 200A can maximize the multilayer film structure that makes the reflectance highest, and manufacture the optical system having a desired optical characteristic. In other words, the inventive manufacturing method 200A can manufacture the multilayer film having the desired reflection surface shape using the multilayer film structure that maximizes the reflectance of the multilayer film. The multilayer mirror manufactured by the inventive manufacturing method 200A has a high reflectance, and realizes an optical apparatus having an excellent throughput. Without a stress relaxation layer or a specific coating structure, the manufacturing process of the multilayer mirror is maintained simple (or can achieve a short manufacturing time period), and can easily make a multilayer mirror having an excellent optical characteristic. Even when the film thickness distribution of the formed multilayer film is different from the designed value, the wavefront aberration is restrained down to an extremely small value, and an excellent optical characteristic can be achieved.

The inventive manufacturing method 200A previously selects the multilayer mirrors having reflection surface shapes to be adjusted, but may select the multilayer mirrors having reflection surface shapes to be adjusted after all the multilayer films are formed on all the multilayer mirrors (or after all the multilayer mirrors are manufactured). In that case, only the multilayer film should be removed from the substrate on which the multilayer film is formed. In reality, chemical etching is used to remove the multilayer film, and the substrate is also etched. Thus, it is very difficult to remove only the multilayer film. Therefore, it is preferable to previously select as in this embodiment the multilayer mirrors having reflection surface shapes to be adjusted, instead of forming the multilayer film on the substrate of the multilayer mirror. Although it is of course possible to process the substrate from which the multilayer film is etched, into the reflection surface shape calculated by the step s216, this method is not preferable due to a long processing time period.

Fourth Embodiment

Figure 7:
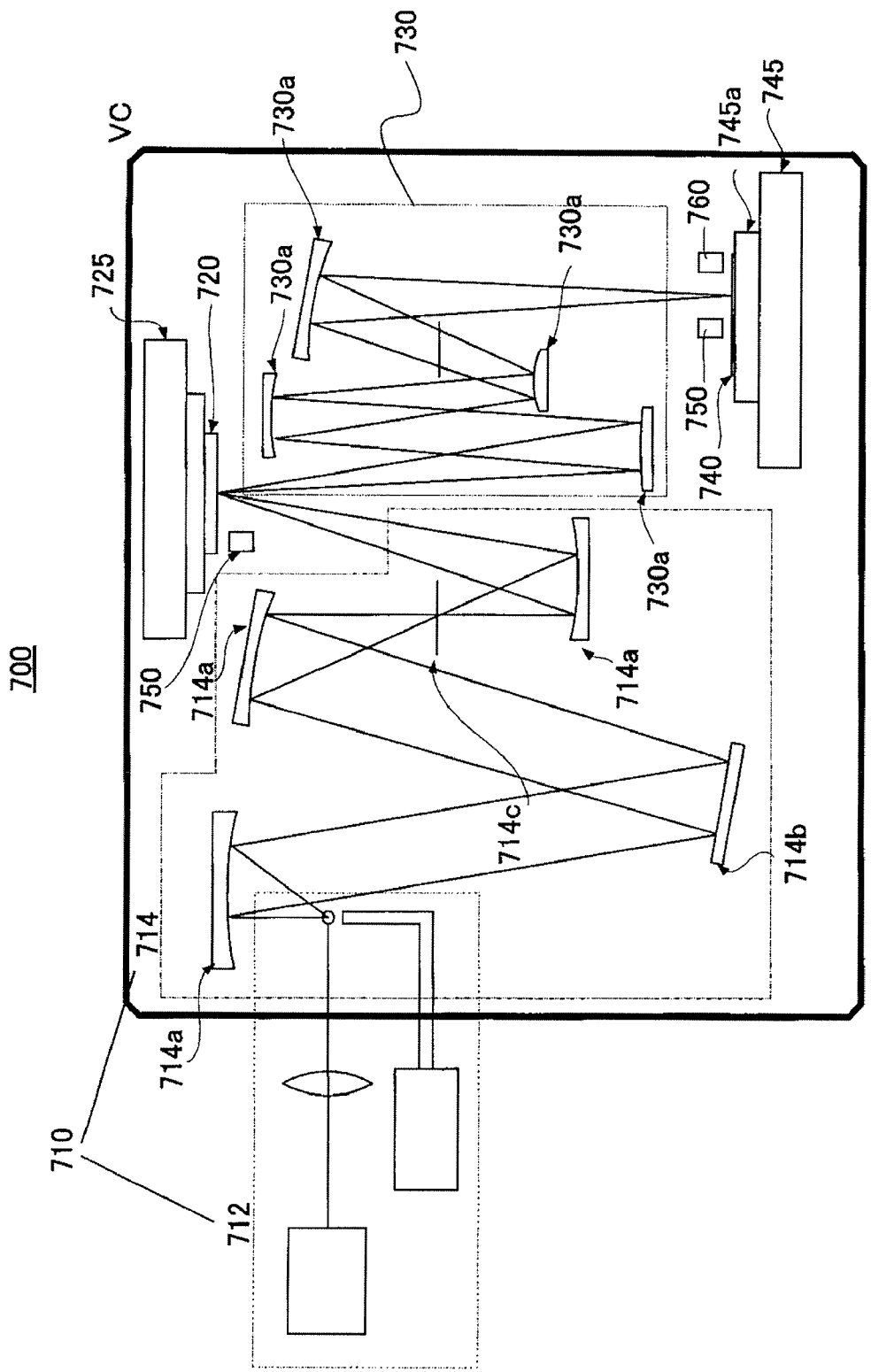
FIG. 7 is a schematic sectional view showing a structure of an exposure apparatus as one aspect of the present invention.

Referring now to FIG. 7, a description will be given of an illustrative exposure apparatus 700 according to the present invention. Here, FIG. 7 is a schematic sectional view of the inventive exposure apparatus 700.

The exposure apparatus 700 is a projection exposure apparatus that uses the EUV light (with a wavelength of, e.g., 13.4 nm) as illumination light for exposure, and exposes onto the plate 740 a circuit pattern of the mask 720, for example, in a step-and-scan manner or step-and-repeat manner. This exposure apparatus is suitable for a lithography process less than submicron or quarter micron, and this embodiment uses the step-and-scan exposure apparatus (also referred to as a "scanner") as an example. The "step-and-scan manner," as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 7, the exposure apparatus 700 includes an illumination apparatus 710, a mask 720, a mask stage 725, a projection optical system 730, a plate 740, a wafer stage 745, an alignment detection mechanism 750, and a focus position detection mechanism 760.

A vacuum chamber VC is provided as shown in FIG. 7, so that at least the optical path through which the EUV light travels is maintained in a vacuum atmosphere, since the EUV light has a low transmittance in air, and a reaction with the residue gas, such as the polymer organic gas, generates contaminants.

The illumination apparatus 710 is an illumination optical apparatus that uses the arc EUV light corresponding to the arc field in the projection optical system 730 to illuminate the mask 720, and includes an EUV light source 712 and an illumination optical system 714.

The EUV light source 712 uses, for example, a laser plasma light source. The laser plasma light source irradiates a highly intensified pulse laser beam to a target material put in vacuum, thus generating high-temperature plasma for use as EUV light with a wavelength of about 13 nm emitted from this. The target material may use a metallic thin film, inert gas, and droplets, etc. The pulse laser preferably has high repetitive frequency, e.g., usually several kHz, for increased average intensity of the emitted EUV light.

The illumination optical system 714 includes a condenser mirror 714a, and an optical integrator 714b. The condenser mirror 714a serves to collect the EUV light that is radiated approximately isotropically from the laser plasma. The optical integrator 714b serves to uniformly illuminate the mask 720 with a predetermined aperture. The illumination optical system 714 may have an aperture at a position conjugate with the reticle 720, so as to restrict the illumination area of the reticle 720 to an arc shape. A catoptric optical element, such as a condenser mirror 714a, in the illumination optical system is manufactured by an inventive manufacturing method 100. Alternatively, the illumination optical system may be manufactured by the inventive manufacturing method 200 or 200A. Thereby, the illumination optical system 714 can exhibit an excellent optical characteristic.

The mask 720 is a reflection mask, and has a circuit pattern (or image) to be transferred. It is supported and driven by a mask stage 725. The diffracted light emitted from the mask 720 is projected onto the plate 740 after reflected by the projection optical system 730. The mask 720 and plate 740 are arranged optically conjugate with each other. Since the exposure apparatus 700 of this embodiment is a scanner, the mask 720 and plate 740 are scanned in projecting the pattern of the mask 720 onto the plate 740.

The mask stage 725 supports the mask 720 and is connected to a moving mechanism (not shown). The mask stage 725 may use any structure known in the art. A moving mechanism (not shown) may include a linear motor etc., and drives the mask stage 725 at least in a direction X and moves the mask 720. The exposure apparatus 700 scans the mask 720 and the plate 740 synchronously. The exposure apparatus 700 assigns the direction X to scan the mask 720 or the plate 740, a direction Y perpendicular to the direction X, and a direction Z perpendicular to the mask 720 or the plate 740.

The projection optical system 730 uses plural multilayer mirrors 730a to project a reduced size of the pattern of the mask 720 onto the plate 740. The number of mirrors 730a is about four to six. For wide exposure area with the small number of mirrors, the mask 720 and plate 740 are simultaneously scanned to transfer a wide area that is an arc-shaped area or ring field apart from the optical axis by a predetermined distance. The projection optical system 730 has a NA of about 0.2 to 0.3. The optical element, such as the multilayer mirror 730a, in the projection optical system 730 is manufactured by the inventive manufacturing method 100. Alternatively, the projection optical system 730 may be manufactured by the inventive manufacturing method 200 or 200A. Thereby, the projection optical system 730 can exhibit an excellent optical characteristic.

The plate 740 is a semiconductor wafer in this embodiment, but may broadly cover a liquid crystal substrate and another plate to be exposed. A photoresist is applied onto the plate 740.

The plate 740 is supported by the wafer stage 745 via a wafer chuck 745a. The wafer stage 745 uses a linear motor to move the plate 740 in XYZ directions. The mask 720 and plate 740 are, for example, scanned synchronously, and the positions of the mask stage 725 and wafer stage 745 are monitored, for example, by a laser interferometer and the like, so that both are driven at a constant speed ratio.

The alignment detection mechanism 750 measures a positional relationship between the position of the mask 720 and the optical axis of the projection optical system 730, and a positional relationship between the position of the plate 740 and the optical axis of the projection optical system 730, and sets positions and angles of the mask stage 725 and the wafer stage 745 so that a projected image of the mask 720 can be positioned in place on the plate 740.

A focus position detection mechanism 760 measures a focus position on the plate 740 plane in the Z direction, and its control over positions and angles of the wafer stage 745 always maintains the plate 740 plane at an imaging position of the projection optical system 730 during exposure.

In exposure, the EUV light emitted from the illumination apparatus 710 illuminates the mask 720, and the pattern of the mask 720 plane is imaged on the plate 740 plane. In this embodiment, the image plane forms an arc or ring-shaped image plane, and the entire surface of the mask 720 is exposed when the mask 720 and plate 740 are scanned at a speed of a reduction ratio.

The illumination optical system 714 and projection optical system 730 in the exposure apparatus 700 includes a catoptric optical element manufactured by the inventive manufacturing method 100 or are manufactured by the inventive manufacturing method 200, or 200A. Therefore, the illumination optical system 714 and the projection optical system 730 reflect the EUV light with a high reflectance, and exhibit an excellent imaging characteristic. Thereby, the exposure apparatus 700 can provide high-quality devices, such as a semiconductor device, an LCD device, an imaging device (CCDs), and a thin-film magnetic head, at a high throughput and a high economic efficiency.

Fifth Embodiment

Figure 8:
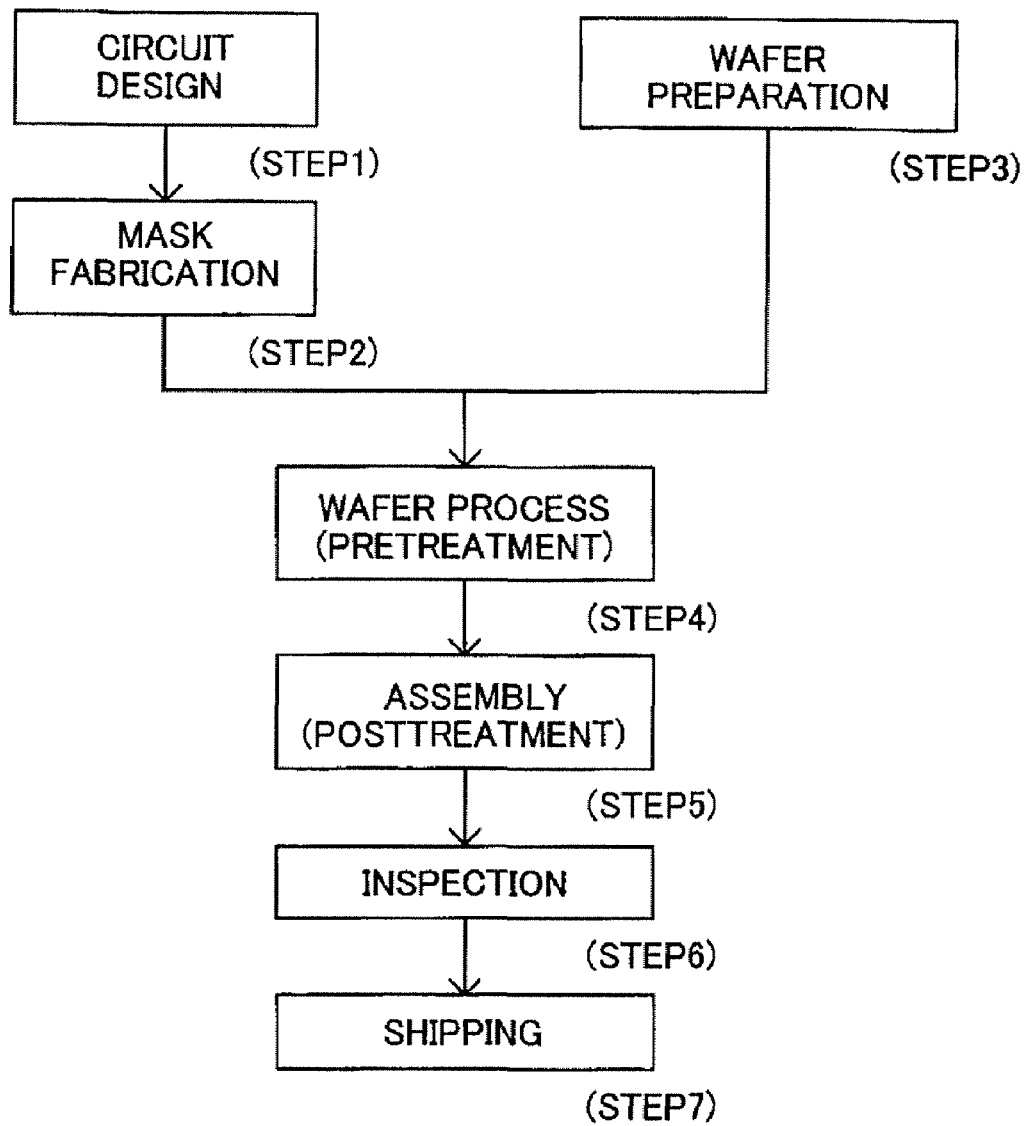
FIG. 8 is a flowchart for explaining the manufacture of devices (such as semiconductor chips such as ICs, LCDs, and CCDs).
Figure 9:
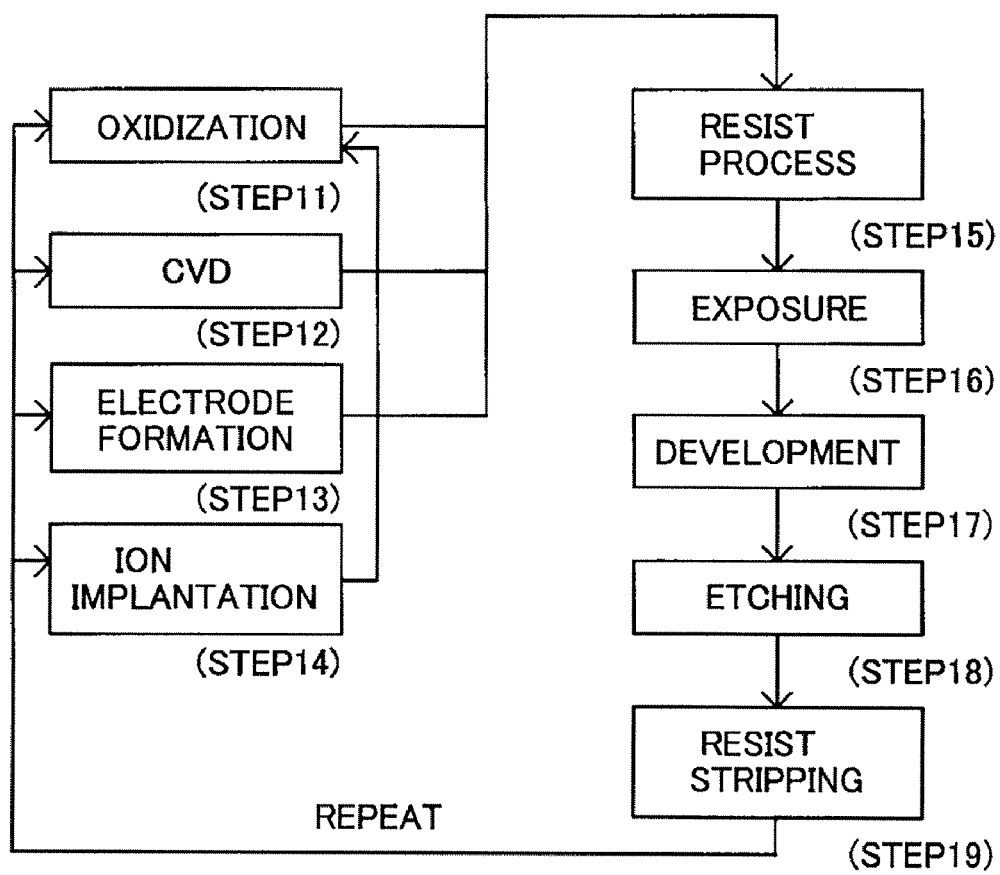
FIG. 9 is a detailed flowchart of a wafer process in step 4 in FIG. 8.

Referring to FIGS. 8 and 9, a description will now be given of an embodiment of a device fabricating method using the above exposure apparatus 700. FIG. 8 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 700 to transfer a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacturing method of this embodiment may manufacture higher quality devices than ever. Thus, the device manufacturing method using the exposure apparatus 700, and the devices as finished goods also constitute one aspect of the present invention.

Further, the present invention is not limited to these preferred embodiments, and various variations and modifications may be made without departing from the scope of the present invention.

This application claims priority from Japanese Patent Application No. 2005-295848, filed Oct. 11, 2005, which is hereby incorporated by reference herein.

What is claimed is:

1. A method for manufacturing a multilayer mirror that includes a substrate and a multilayer film formed on the substrate, said method comprising the steps of:

calculating a desired shape of a reflection surface for the multilayer mirror based on an optical characteristic required for the multilayer mirror;

estimating a surface shape variation amount as a difference between a shape of a surface of the substrate before the multilayer film is formed on the substrate and a surface shape of the reflection surface of the multilayer mirror after the multilayer film is formed on the surface;

processing the surface shape of the substrate into a shape generated by subtracting the surface shape variation amount from the desired shape of the reflection surface; and forming the multilayer film on the substrate processed by said processing step.

2. A method for manufacturing an optical system that includes plural multilayer mirror, said method comprising the steps of:

producing a first part of the multilayer mirrors by the steps of calculating a desired shape of a reflection surface for each multilayer mirror of the first part based on an optical characteristic required for the optical system, processing the surface of a substrate based on the desired shape of the reflection surface, and forming multilayer film on the substrate processed by said process step;

producing a second part of the multilayer mirrors by the steps of calculating a shape of a reflection surface for each multilayer mirror of the second part necessary for obtaining the optical characteristic, estimating a surface shape variation amount as a difference between a shape of a surface of a substrate before a multilayer film is formed on the surface and a shape of the reflection surface of the multilayer mirror after the multilayer film is formed on the surface, processing the surface of the substrate into a shape generated by subtracting the surface shape of variation amount from the desired shape of the reflection surface, and forming the multilayer film on the substrate processed by said process step; and incorporating the plural multilayer mirrors into a mirror barrel.

3. A method according to claim 2, wherein said estimating step includes the steps of:

measuring an optical characteristic when the part produced by said producing step is incorporated into the mirror barrel, and calculating the reflection surface shape necessary for obtaining the optical characteristic based on a measurement result obtained by said measuring step.

* * * * *